(12) United States Patent
Yagi et al.

(10) Patent No.: US 10,096,630 B2
(45) Date of Patent: Oct. 9, 2018

(54) PHOTODETECTOR AND RADIATION DETECTOR

(71) Applicant: KABUSHIKI KAISHA TOSHIBA, Minato-ku (JP)

(72) Inventors: Hitoshi Yagi, Yokohama (JP); Rei Hasegawa, Yokohama (JP); Masaki Atsuta, Yokosuka (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/692,079

(22) Filed: Aug. 31, 2017

(65) Prior Publication Data

US 2018/0261634 A1 Sep. 13, 2018

(30) Foreign Application Priority Data

Mar. 9, 2017 (JP) .................................. 2017-045108

(51) Int. Cl.
*H01L 27/14* (2006.01)
*H01L 27/144* (2006.01)
(Continued)

(52) U.S. Cl.
CPC .... *H01L 27/1446* (2013.01); *H01L 21/76898* (2013.01); *H01L 23/481* (2013.01);
(Continued)

(58) Field of Classification Search
CPC ....... H01L 2031/0344; H01L 31/02162; H01L 25/042; H01L 25/043; H01L 27/14603;
(Continued)

(56) References Cited

U.S. PATENT DOCUMENTS 8,008,741 B2 8/2011 Yamamura et al.
8,558,387 B2 * 10/2013 Kato .................. H01L 21/6835
257/774
(Continued)

FOREIGN PATENT DOCUMENTS

JP 4707885 6/2011
JP 5183471 4/2013
(Continued)

OTHER PUBLICATIONS

F. Zappa, et al. "Principles and features of single-photon avalanche diode arrays," Sensors and Actuator A., vol. 140, 2007, pp. 10.
(Continued)

*Primary Examiner* — Thanh Y Tran
(74) *Attorney, Agent, or Firm* — Oblon, McClelland, Maier & Neustadt, L.L.P.

(57) ABSTRACT

A photodetector according to an embodiment includes: a substrate with a first and second faces; pixels disposed to the substrate, each pixel including: light detection cells disposed on the first face, each light detection cell being surrounded by a first opening having a continuous closed curve shape formed on the second face when viewed from a side of the second face; a first wiring line disposed on the first face to connect to each of the light detection cells; first electrodes, each of the first electrodes being disposed in corresponding one of third openings and connected to the second face, the third openings being disposed in a first insulating film and exposing a part of respective regions of the light detection cells in the second face; a second electrode disposed on the second surface and connecting the first electrodes; and a light blocking material filled to the first opening.

16 Claims, 11 Drawing Sheets

(51) Int. Cl.
  *H01L 21/768* (2006.01)
  *H01L 23/48* (2006.01)
  *H01L 27/146* (2006.01)

(52) U.S. Cl.
  CPC .... *H01L 27/1463* (2013.01); *H01L 27/14623* (2013.01); *H01L 27/14685* (2013.01); *H01L 27/14687* (2013.01)

(58) Field of Classification Search
  CPC ......... H01L 27/14605; H01L 21/76898; H01L 27/14687; H01L 23/481; H01L 27/14685; H01L 27/14663; H01L 27/14623; H01L 27/1463
  See application file for complete search history.

(56) References Cited

U.S. PATENT DOCUMENTS

| | | | |
|---|---|---|---|
| 9,496,310 | B2 | 11/2016 | Yagi et al. |
| 9,508,775 | B2 * | 11/2016 | Kobayashi ........ H01L 27/14632 |
| 2013/0119501 | A1 | 5/2013 | Yoshida |
| 2015/0084149 | A1 | 3/2015 | Yagi et al. |
| 2016/0254310 | A1 * | 9/2016 | Yagi ................. H01L 27/14663 257/435 |

FOREIGN PATENT DOCUMENTS

| | | |
|---|---|---|
| JP | 5450295 | 3/2014 |
| JP | 2015-55507 | 3/2015 |
| JP | 2015-61041 | 3/2015 |
| JP | 2016-162772 | 9/2016 |

OTHER PUBLICATIONS

R. Mirzoyan, et al., "Light emission in Si avalanches," Nuclear Instruments and Methods in Physics Research, A 610, 2009, pp. 3.

Massimo Mazzillo et al. "High Fill Factor P-on-N Silicon Photomultipliers for Blue Light Detection," 2012 IEEE Nuclear Science Symposium and Medical Imaging Conference Record (NSS/MIC), 2012, pp. 8.

Roberto Pagano et al. "Dark Current in Silicon Photomultiplier Pixels: Data and Model," IEEE Transactions on Electron Devices, vol. 59, No. 9, Sep. 2012, pp. 7.

R. Pagano et al. "Understanding dark current in pixels of silicon photomultipliers," Solid-State Device Research Conference (ESSDERC), 2010 Proceedings of the European, 2010, pp. 4.

M.Mazzillo et al. "High Fill Factor P-on-N Silicon Photomultipliers for Blue Light Detection," Nuclear Science Symposium and Medical Imaging Conference (NSS/MIC), IEEE, 2012 pp. 1.

F.Acerbi et al. "Technological and Design Improvements of FBK NUV Silicon-Photomultipliers," Fotonica AEIT Italian Conference on Photonics Technologies, 2015, pp. 3.

* cited by examiner

PHOTODETECTOR AND RADIATION DETECTOR

CROSS REFERENCE TO RELATED APPLICATIONS

This application is based upon and claims the benefit of priority from prior Japanese Patent Application No. 2017-045108 filed on Mar. 9, 2017 in Japan, the entire contents of which are incorporated herein by reference.

FIELD

Embodiments described herein relate generally to a photodetector and a radiation detector.

BACKGROUND

Photodetectors in which light detection cells with avalanche photodiodes ("APDs") operating in Geiger mode are arranged in arrays have been studied in order to achieve photodetectors with high sensitivity. These photodetectors count the number of photons that are incident thereto. The APD operating in Geiger mode is a photodiode that emits one current pulse per one photon incident thereto. An array including the light detection cells with the APDs provides a current pulse having a height proportional to the number of light detection cells receiving the photons. Thus, the number of photons incident to each photodetector can be measured from the pulse height.

A problem is known for the arrays of light detection cells including APDs operating in Geiger mode that light rays in a wavelength band from the visible light to the far-infrared light are radiated from a light detection cell to which photons enter, and the radiation rays enter adjacent light detection cells ("optical crosstalk").

A technique is known to solve this problem, in which trenches are formed between adjacent two light detection cells with APDs from a side opposite to the substrate on which the light detection cells are formed, i.e., from the light detection cell side, and filled with black resist or a metal such as tungsten. This blocks light rays from adjacent light detection cells to prevent the optical crosstalk. However, the preventing of optical crosstalk is insufficient.

The optical crosstalk prevention technique has furthermore the following problems. In the case of using black resist as a light blocking material, during the manufacture, the light detection cells with the APDs are generally subjected to a high-temperature process performed at a temperature of 400° C. or more. Therefore, the black resist, which generally does not bear such high temperatures, cannot be actually used.

A metal such as tungsten is generally filled into the trenches by sputtering or chemical vapor deposition (CVD). However, these methods, which are generally used to form thin films, are not capable of filling the trenches efficiently. Therefore, voids may be caused to reduce the reliability.

DETAILED DESCRIPTION

A photodetector according to an embodiment includes: a substrate with a first face and a second face that is opposite to the first face; a plurality of pixels disposed to the substrate, each pixel including: a plurality of light detection cells disposed on the first face of the substrate, each light detection cell having a first terminal and a second terminal that connect to the substrate, each light detection cell being surrounded by a first opening having a continuous closed curve shape formed on the second face when viewed from a side of the second face of the substrate; a first wiring line disposed on the first face of the substrate to connect to the first terminal of each of the light detection cells; a first insulating film covering the second face of the substrate and a side face of a second opening disposed on the second face of the substrate, and penetrating the substrate to expose a part of the first wiring line, and a side face and a bottom of the first opening; a plurality of first electrodes, each of the plurality of the first electrodes being disposed in corresponding one of third openings and connected to the second face of the substrate, the third openings being disposed in the first insulating film and exposing a part of respective regions of the light detection cells in the second face of the substrate; a second electrode disposed on the second surface of the substrate and connecting the plurality of the first electrodes; and a light blocking material filled to the first opening.

The embodiments of the present invention will be described below with reference to the accompanying drawings. It should be noted, however, that the drawings are schematically illustrated, and the relationship between the thickness and the planar dimensions, and the ratio among the thicknesses of the respective layers in each drawing may be different from those of actual devices. The actual thicknesses and dimensions, therefore, should be determined in consideration of the following descriptions. Furthermore, the relationship and the ratio between the dimensions may differ between the drawings.

First Embodiment

Figure 1:
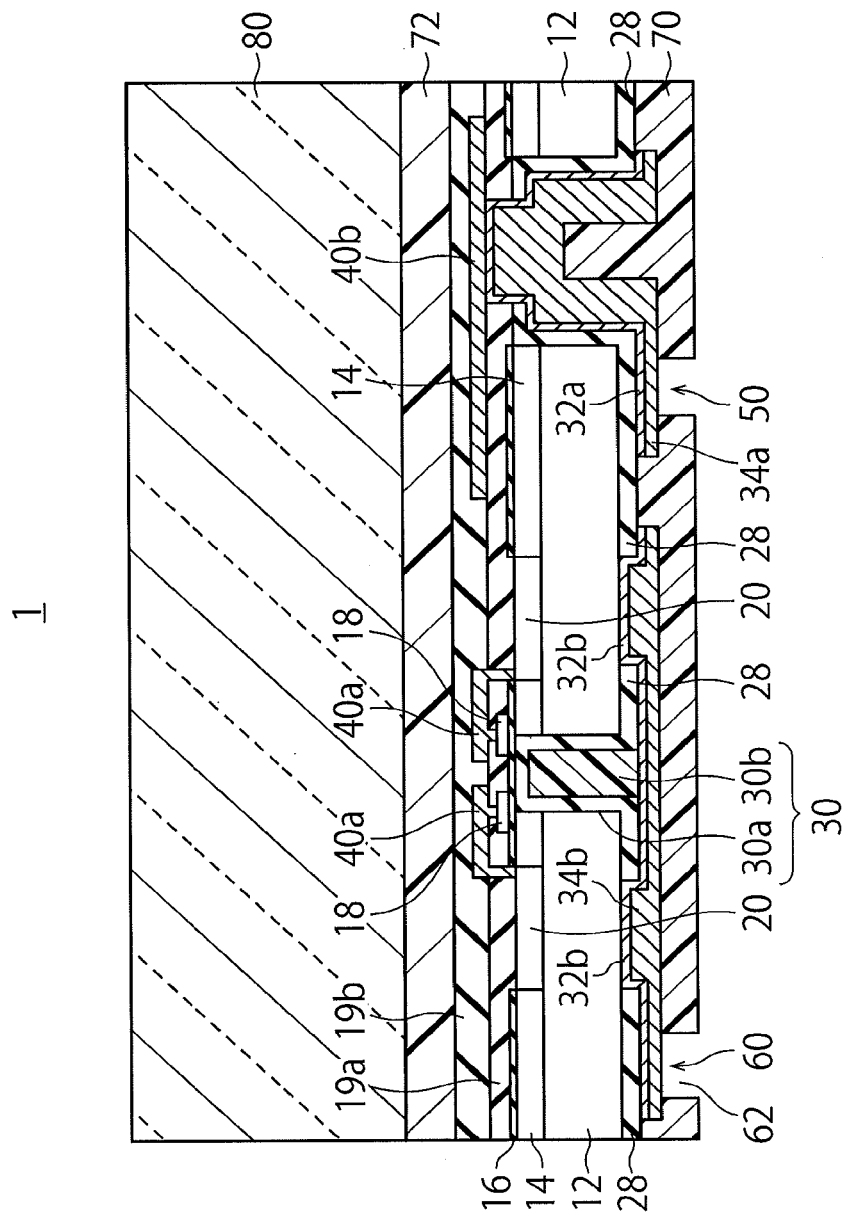
FIG. 1 is a cross-sectional view of a photodetector according to a first embodiment.
Figure 2:
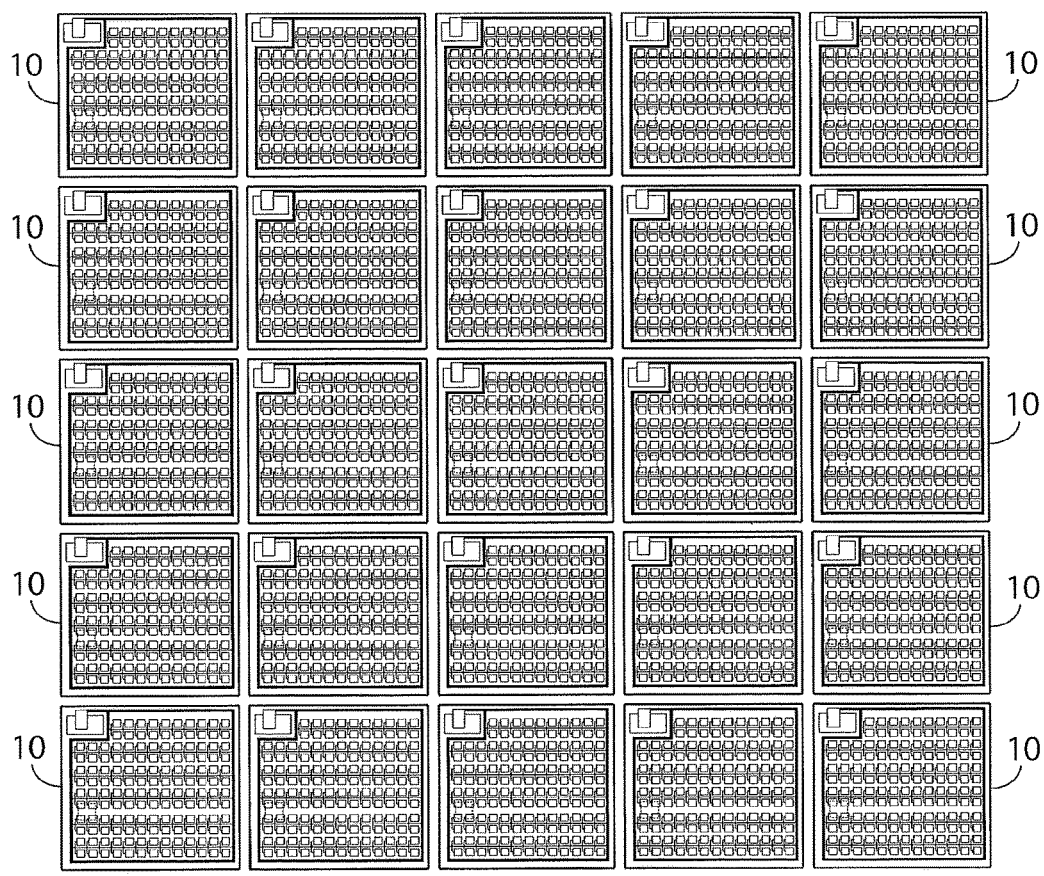
FIG. 2 is a plan view of the photodetector according to the first embodiment.
Figure 3:
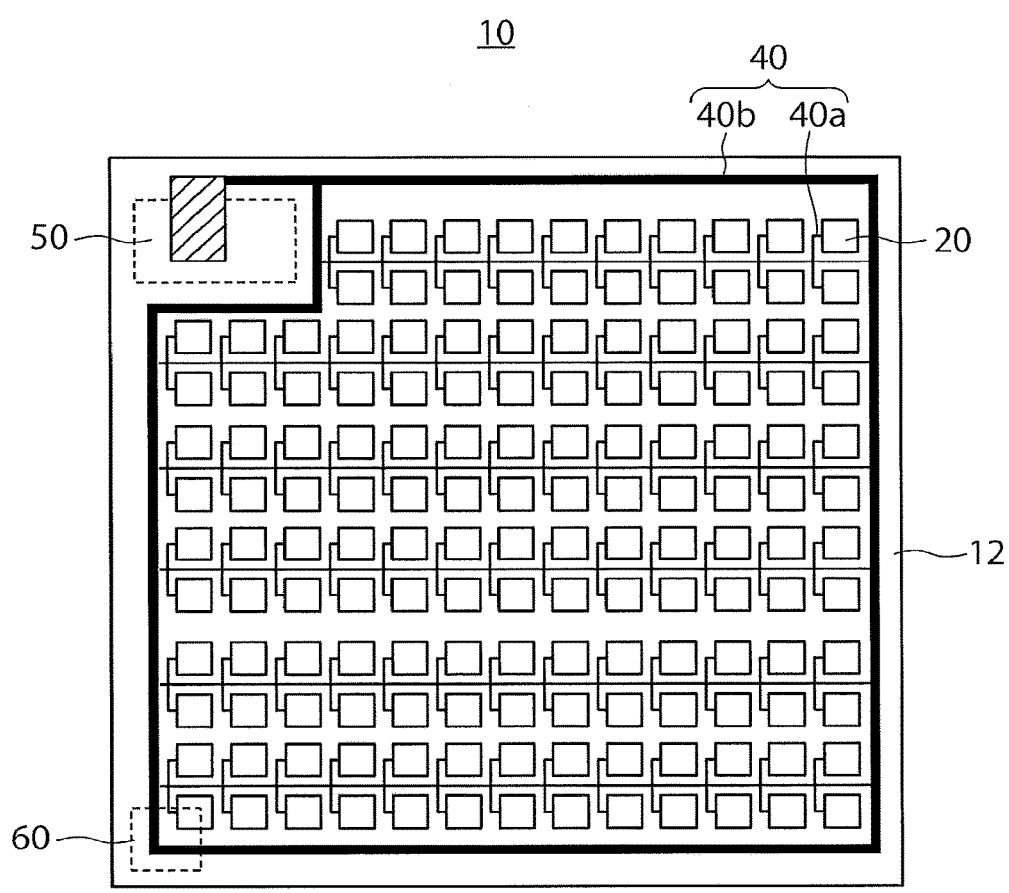
FIG. 3 is a plan view of one of the pixels of the photodetector according to the first embodiment.
Figure 4:
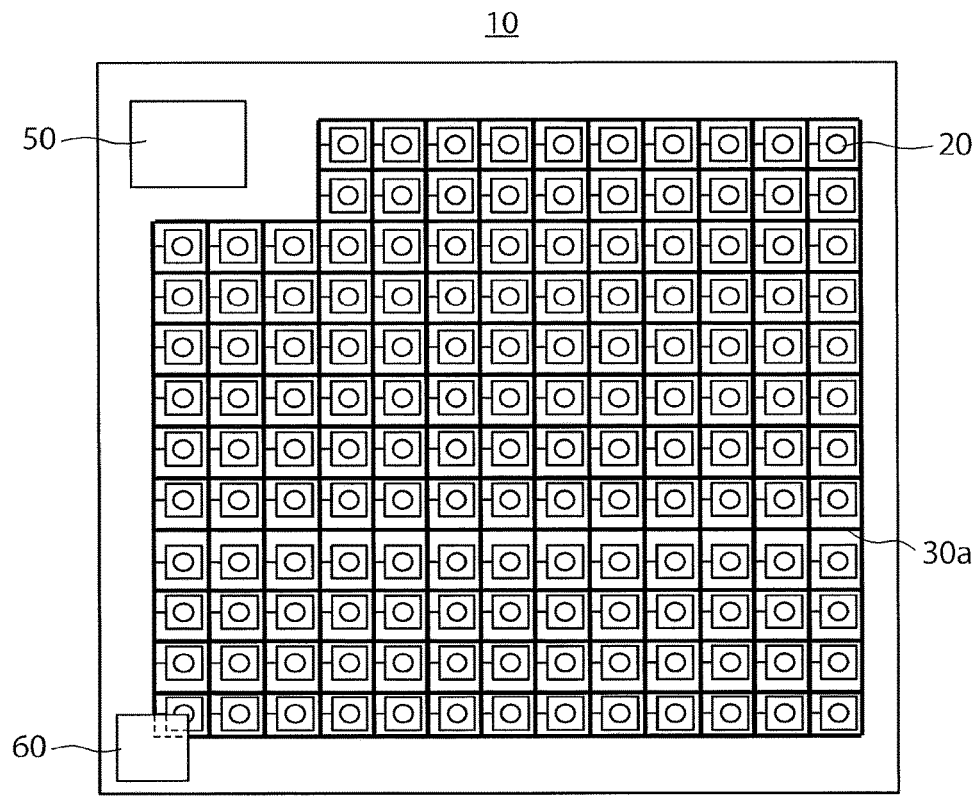
FIG. 4 is a plan view showing light blocking grooves of the photodetector according to the first embodiment.

A photodetector according to a first embodiment will be described below with reference to FIGS. 1 to 4. FIG. 1 is a cross-sectional view of the photodetector 1 according to the first embodiment. FIG. 2 is a plan view of the photodetector 1 according to the first embodiment, and FIG. 3 is a plan view of one of the pixels of the photodetector 1 according to the first embodiment. FIG. 4 is a plan view showing light blocking grooves of the photodetector 1 according to the first embodiment.

As shown in FIG. 2, the photodetector 1 according to the first embodiment includes a plurality of pixels 10 arranged to form an array. In FIG. 2, a pixel array with five rows and five columns is shown. As shown in FIG. 3, each pixel 10 is formed on an n-type silicon substrate 12, for example, and includes a plurality of light detection cells 20 arranged in an array, wiring lines 40 of aluminum (Al), for example, a TSV (Through Silicon Via) electrode 50, and a backside electrode 60. The wiring lines 40 include wiring lines 40a disposed near the light detection cells 20, and a wiring line 40b connecting to the wiring lines 40a and extends around the pixel 10. As will be described later, the TSV electrode 50 and the backside electrode 60 are disposed on the opposite side of the silicon substrate 12 to the light detection cells 20.

Each of light detection cells 20 includes an avalanche photodiode (APD). Each of the light detection cells 20 include a first terminal, which is connected to one terminal of a quench resistor described later via wiring line 40a. The other terminal of the quench resistor is connected to the wiring line 40b, and the wiring line 40b is connected to the TSV electrode 50 located at a corner of each pixel 10. It is at the upper left corner in FIG. 3.

A second terminal of each of light detection cells 20 is connected to a backside electrode 60 via the silicon substrate and a backside contact described later. The backside electrode 60 is located at another corner that is different from the corner where the TSV electrode 50 is present. It is at the lower left corner in FIG. 3. Therefore, the plurality of the light detection cells are connected in parallel with each other via corresponding one of the quench resistors.

The cross-sectional structure of the photodetector 1 according to the first embodiment will be described with reference to FIG. 1. A p$^-$-type epitaxial layer 14 is disposed on the silicon substrate 12, which is an n-type silicon substrate, and the light detection cells 20 with the APDs are disposed on the epitaxial layer 14. The light detection cells 20 each have a p$^+$-type semiconductor layer. The p$^+$-type semiconductor layer, p$^-$-type epitaxial layer 14, and the n-type silicon substrate 12 forms an APD.

The light detection cells 20 are isolated from each other by an insulating film 16 of silicon oxide, for example, disposed on the epitaxial layer 14. Therefore, upper surfaces of the light detection cells are not covered by the insulating film 16, and are openings to which light is incident. The insulating film 16 is formed by, for example, local oxidation of silicon (LOCOS).

On the insulating film 16 are disposed quench resistors of polycrystalline silicon, for example, at locations corresponding to the light detection cells. The quench resistors 18, the light detection cells 20, and the insulating film 16 are covered by an interlayer insulating film 19a of silicon oxide, for example. The interlayer insulating film 19a has first contacts of Al, for example, which connect to the light detection cells 20, and second contacts of Al, for example, connecting to the quench resistors 18. The first contacts and the second contacts are connected by the Al wiring lines 40a disposed on the interlayer insulating film 19a. The Al wiring lines 40b connecting to the TSV electrode 50 are also disposed on the interlayer insulating film 19a. Each of the quench resistors 18 is connected to corresponding one of the light detection cells in series via the Al wiring line 40a.

An interlayer insulating film 19b of silicon oxide, for example, is disposed to cover the interlayer insulating film 19a and the Al wiring lines 40a, 40b. A transparent support member 80 of glass, for example, is disposed on the interlayer insulating film 19b via an adhesion layer 72. Light rays are incident to the light detection cells 20 through the support member 80. The adhesion layer 72 has a transparency sufficient to pass light rays. The thickness of the adhesion layer 72 is about a few tens μm to 100 μm.

The TSV electrode 50, the backside electrode 60, and light blocking portions 30 are disposed on a surface (back surface) of the silicon substrate 12 that is opposite to the surface (top surface) where the light detection cells 20 are present. The TSV electrode 50 is formed in a second opening formed on the back surface side of the silicon substrate 12. The bottom of the second opening reaches the wiring line 40b. An insulating film 28 of silicon oxide, for example, is disposed to cover a side surface of the second opening and the back surface side of the silicon substrate 12. The TSV electrode 50 includes a barrier metal layer 32a of Ti, for example, covering the bottom and the side surface of the second opening, and an electrode layer 34a of Cu, for example, covering the barrier metal layer 32a. The barrier metal layer 32a of the TSV electrode 50 is electrically insulated from the silicon substrate 12 and the epitaxial layer 14 by the insulating film 28 of silicon oxide, for example.

The backside electrode 60 is disposed on the back surface side of the silicon substrate 12. The insulating film 28 has a third opening reaching the back surface of the silicon substrate 12. The backside electrode 60 is formed in the third opening. The backside electrode 60 includes a barrier metal layer 32b of titanium (Ti), for example, covering the bottom and the side surface of the third opening, and an electrode layer 34b of copper (Cu), for example, covering the barrier metal layer 32b. The electrode layer 34b is also referred to a backside contact 34b.

The light blocking portion 30 includes a light blocking groove 30a penetrating the silicon substrate 12 and the epitaxial layer 14 to reach the insulating film 16, and a light blocking material 30b being filled into the light blocking groove 30a. In the first embodiment, black resist is used as the light blocking material 30b. Furthermore, in the first embodiment, the insulating film 28 is disposed between the bottom and the side surface of the light blocking groove 30a and the light blocking material 30b. If the light blocking material 30b is an electrically insulating material, the insulating film 28 is not needed between the bottom and the side surface of the light blocking groove 30a and the light blocking material 30b. In the embodiment, the light blocking material 30b is formed to bury the blocking groove 30a, but the light blocking material 30b may be formed to be a film that covers a bottom surface and a side surface of the blocking groove 30a.

As shown in FIG. 4, the light blocking grooves 30a are arranged to surround the respective light detection cells 20 when viewed from the back surface side of the silicon substrate 12. The light blocking grooves 30a have no cutout and are continued. Thus, each of the light blocking grooves 30a is arranged to form a closed curve completely surrounding the respective light detection cells 20 when viewed from the back surface side of the silicon substrate 12. Since the light detection cells 20 are completely separated from each other by the light blocking grooves 30a, it is possible to largely reduce optical crosstalk.

On the other hand, in order to electrically connect between each of the light detection cells and the silicon substrate 12, the electrode layer 34 is provided to each of the light detection cells 20, and the electrode layers 34 are connected to each other.

Returning to FIG. 1, the TSV electrode 50, the backside electrode 60, and the light blocking portion 30 are covered by a solder resist 70, for example. An opening is formed in the solder resist 70 and reaches the TSV electrode 50 and the backside electrode 60. The TSV electrode 50 and the backside electrode 60 are connected to a pad of the mounting substrate (not shown) via the openings.

(Manufacturing Method)

Figure 5:
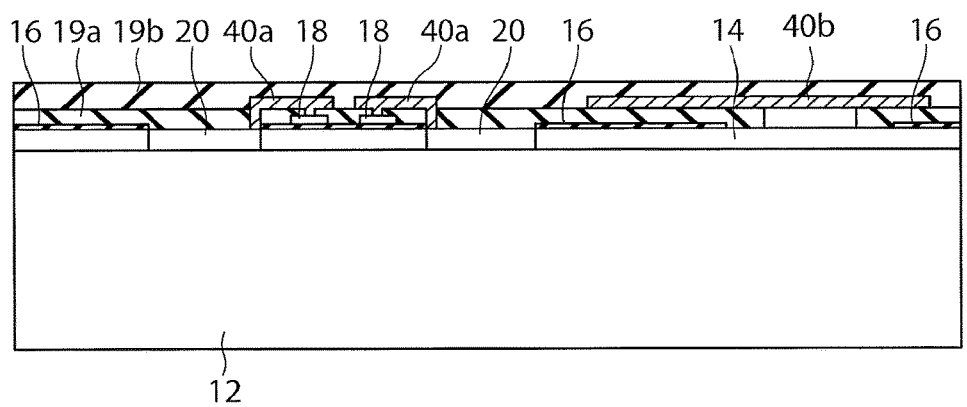
FIG. 5 is a cross-sectional view showing a method of manufacturing the photodetector according to the first embodiment.

A method of manufacturing the photodetector 1 according to the first embodiment will be described below with reference to FIGS. 5 to 13. First, a plurality of light detection cells 20 are formed on a silicon substrate 12 using well-known techniques as shown in FIG. 5. The silicon substrate 12 is, for example, an epitaxially grown silicon substrate in which a p-type epitaxial layer 14 having a thickness of 2 μm is formed on an n-type silicon substrate 12 having a thickness of 725 μm. The light detection cells 20 are formed on the epitaxial layer 14. Each light detection cell 20 includes a p$^+$-type layer having a p-type impurity concentration higher than that of the epitaxial layer 14. The p$^+$-type layer is formed by implanting p-type impurities into the epitaxial layer 14. The p$^+$-type layer, the epitaxial layer 14, and n-type silicon substrate 12 form an avalanche photodiode (APD).

Thereafter, a silicon nitride film serving as a mask is formed on the light detection cells 20, and an insulating film 16 is formed on the exposed epitaxial layer 14 by LOCOS. As a result, adjacent light detection cells 20 become isolated from each other by the insulating film 16.

Quench resistors 18 of polycrystalline silicon, for example, are formed on the insulating film 16. Thereafter, the mask on the light detection cell 20 is removed.

Subsequently, an interlayer insulating film 19a of silicon oxide, for example, is formed to cover the light detection cells 20, the quench resistors 18, and the insulating film 16. Contact holes are formed through the interlayer insulating film 19a so as to reach the light detection cells 20 and the quench resistors 18. A metal wiring layer of Al, for example, is formed on the interlayer insulating film 19a to fill the contact holes. The contact holes filled with Al form contacts. The metal wiring layer is patterned to form wiring lines 40a, 40b. An interlayer insulating film 19b of silicon oxide, for example, is formed on the interlayer insulating film 19a to cover the wiring lines 40a, 40b (FIG. 5).

Figure 6:
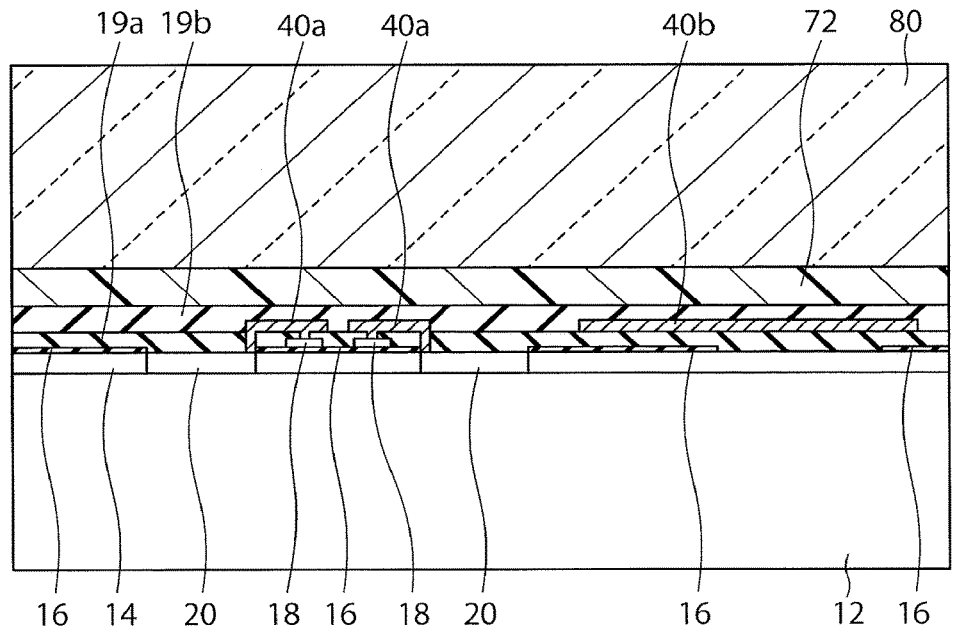
FIG. 6 is a cross-sectional view showing the method of manufacturing the photodetector according to the first embodiment.

Thereafter, an adhesion layer 72 is applied to the interlayer insulating film 19b, and a transparent support member 80 of glass, for example, is disposed on the adhesion layer 72 so that the interlayer insulating film 19b and the support member 80 are bonded with the adhesion layer 72, as shown in FIG. 6. The thickness of the support member 80 is, for example, 350 μm.

Figure 7:
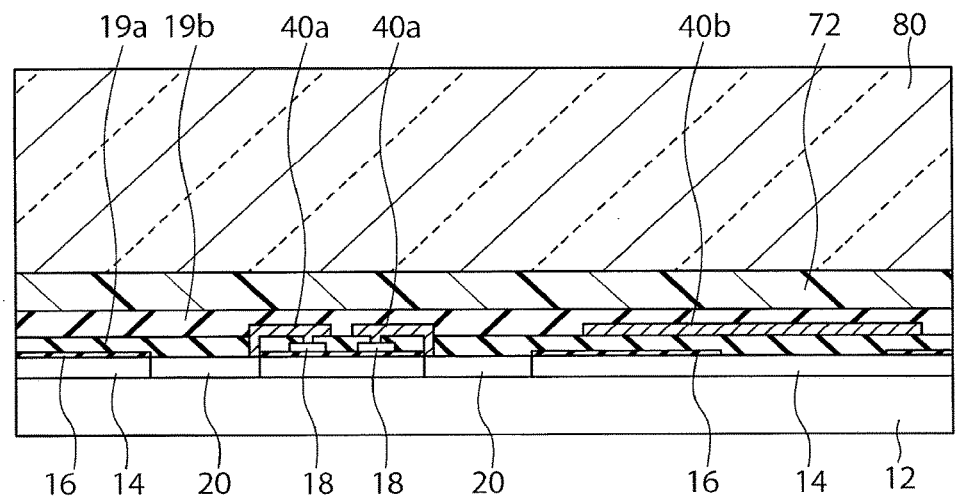
FIG. 7 is a cross-sectional view showing the method of manufacturing the photodetector according to the first embodiment.

Subsequently, the silicon substrate 12 is ground to have a thickness of about 10 μm to 40 μm using the support member 80 as a support, as shown in FIG. 7.

Figure 8:
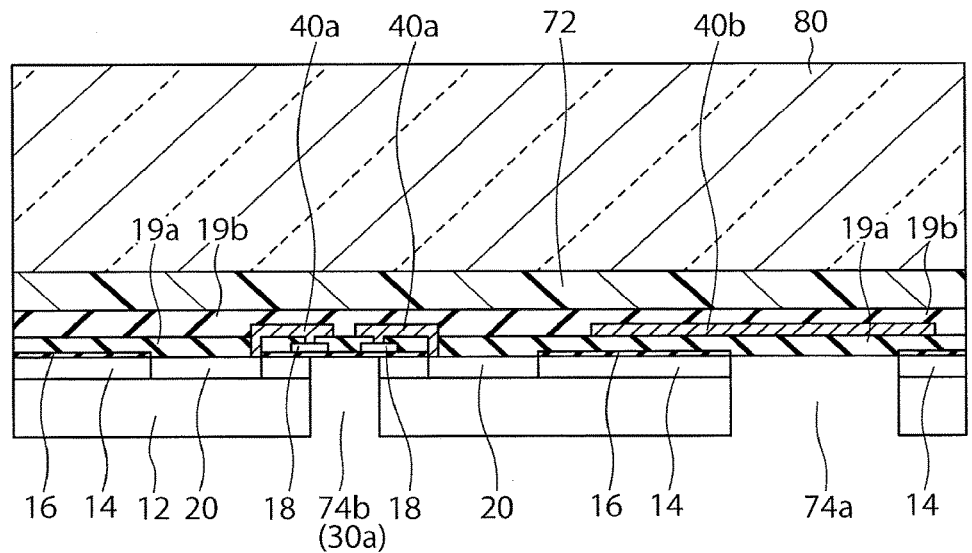
FIG. 8 is a cross-sectional view showing the method of manufacturing the photodetector according to the first embodiment.

Then, openings 74a, 74b are formed by reactive ion etching (RIE) at locations where a TSV electrode 50 and a light blocking portion 30 are to be formed, as shown in FIG. 8. The bottom of the opening 74a is at the interlayer insulating film 19a, and the bottom of the opening 74b is at the insulating film 16. The opening 74b becomes the light blocking groove 30a. The opening 74b is formed to be a closed curve continuously surrounding the respective light detection cells 20 when viewed from the back surface side of the silicon substrate 12.

Figure 9:
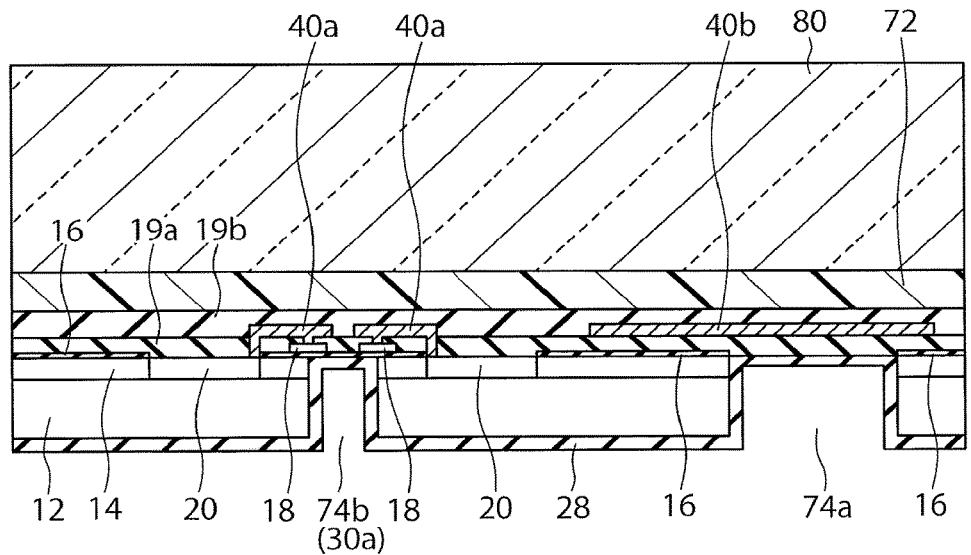
FIG. 9 is a cross-sectional view showing the method of manufacturing the photodetector according to the first embodiment.

Thereafter, a silicon oxide film 28 is formed by chemical vapor deposition (CVD) on the bottom and the side surface of each of the openings 74a, 74b and the exposed back surface of the silicon substrate 12, as shown in FIG. 9.

Figure 10:
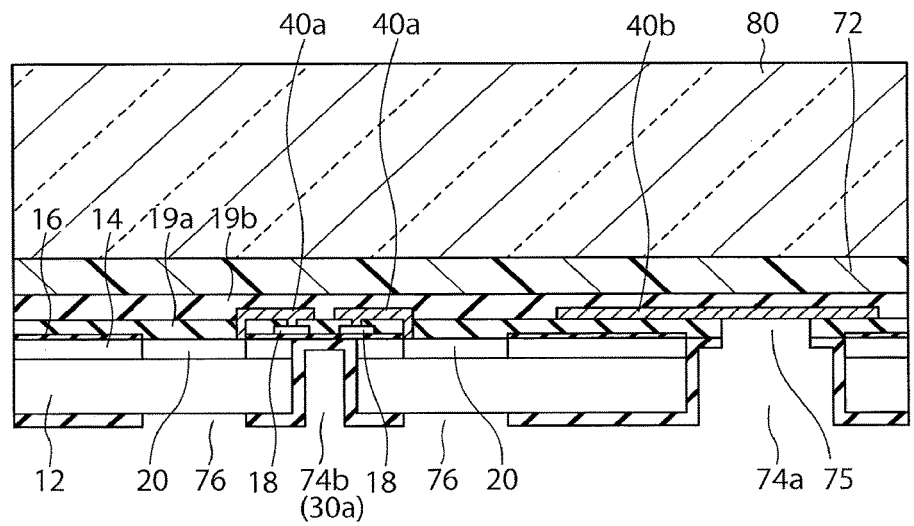
FIG. 10 is a cross-sectional view showing the method of manufacturing the photodetector according to the first embodiment.

Thereafter, an opening 75 communicating with the Al wiring line 40b is formed at the bottom of the opening 74a for the TSV, and an opening 76 reaching to the back surface of the silicon substrate 12 is formed at a location where the backside contact is to be formed in the respective light detection cells 20, as shown in FIG. 10.

Figure 11:
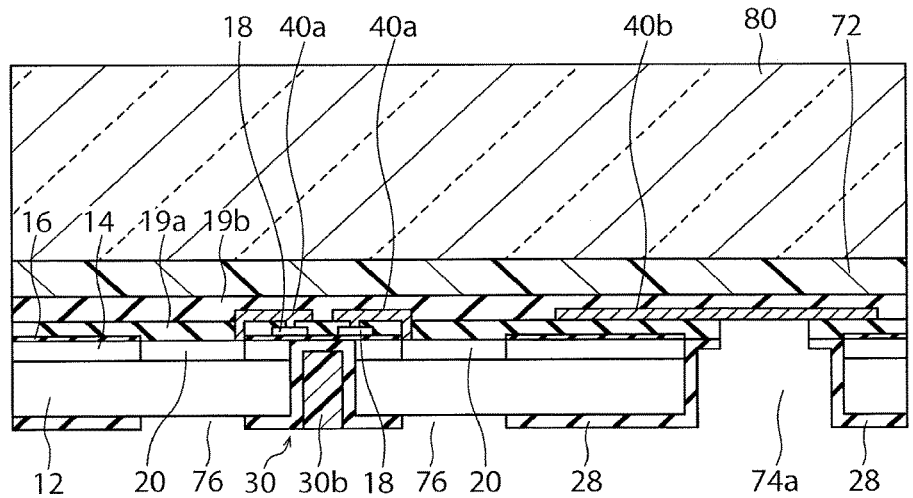
FIG. 11 is a cross-sectional view showing the method of manufacturing the photodetector according to the first embodiment.
Figure 12:
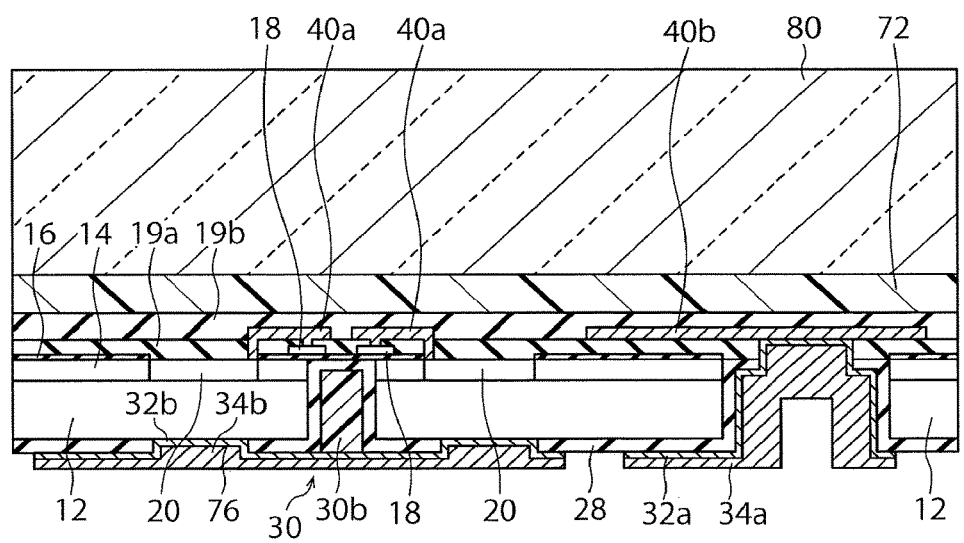
FIG. 12 is a cross-sectional view showing the method of manufacturing the photodetector according to the first embodiment.

As shown in FIG. 11, black resist serving as the light blocking material 30b is selectively filled into the light blocking groove 30a to form a light blocking portion 30.

Subsequently, electrode layers including stacked structures are formed on the bottoms and the side surfaces of the opening 74a for the TSV electrode and the opening 76 for the respective light detection cells 20. The stacked structures include barrier metal layers 32a, 32b of Ti and electrode layers 34a, 34b of Cu. At the same time, electrodes between the light detection cells 20 are formed to be connected to each other, and the light detection cells 20 are electrically connected. The barrier metal layers 32a, 32b of Ti are formed by sputtering, and the electrode layers 34a, 34b of Cu are formed to be thick films by plating. If the electrodes are formed by plating, at least one metal selected from the group consisting of gold (Au), silver (Ag), nickel (Ni), Zinc (Zn), chromium (Cr), and tin (Sn) may be used instead of Cu.

Figure 13:
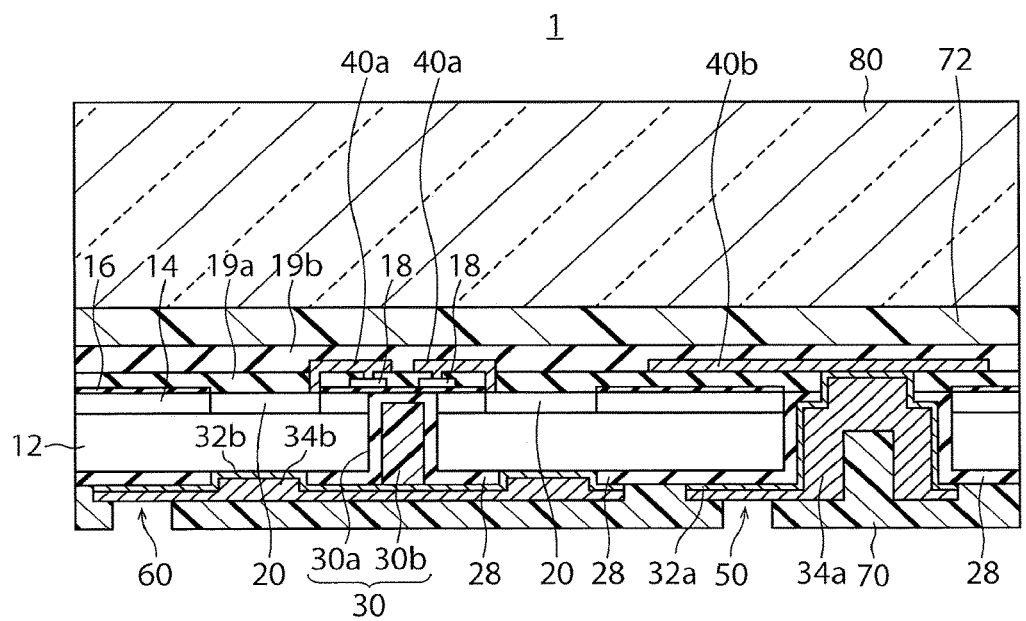
FIG. 13 is a cross-sectional view showing the method of manufacturing the photodetector according to the first embodiment.

Thereafter, a solder resist 70 is applied to the back surface of the silicon substrate 12 to cover the TSV electrode 50, the backside electrode 60, and the light blocking portion 30, as shown in FIG. 13. Subsequently, openings to reach the TSV electrode 50 and the backside electrode 60 are formed, and a thermosetting treatment is performed at a temperature of 200° C. or less. As a result, the photodetector 1 according to the first embodiment is completed.

As described above, the light blocking groove 30a is formed on the back surface side of the silicon substrate 12 in the photodetector according to the first embodiment. This makes it possible to fill the black resist 30b into the light blocking groove 30a after the APDs are formed. Therefore, the black resist is not subjected to a high-temperature process (for example, at a temperature 400° C. or more) to form the APDs. Therefore, black resist, which does not bear high temperatures, may be used as the light blocking material 30b. And since a circumference of each of the light detection cells is formed to be a closed curve continuously surrounding the respective light detection cells 20 when viewed from the back surface side of the silicon substrate 12, it is possible to largely reduce the optical crosstalk.

Second Embodiment

Figure 14:
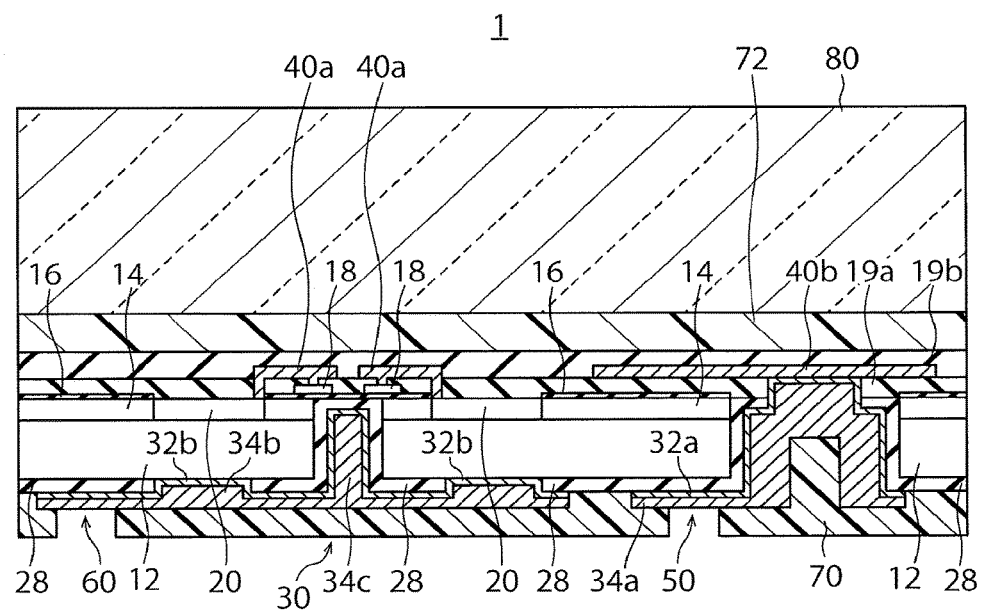
FIG. 14 is a cross-sectional view of a photodetector according to a second embodiment.

FIG. 14 is a cross-sectional view showing a photodetector according to a second embodiment. The photodetector 1 according to the second embodiment is obtained by using a metal, for example Cu, as the light blocking material 30b instead of black resist in the photodetector according to the first embodiment shown in FIG. 1.

Figure 15:
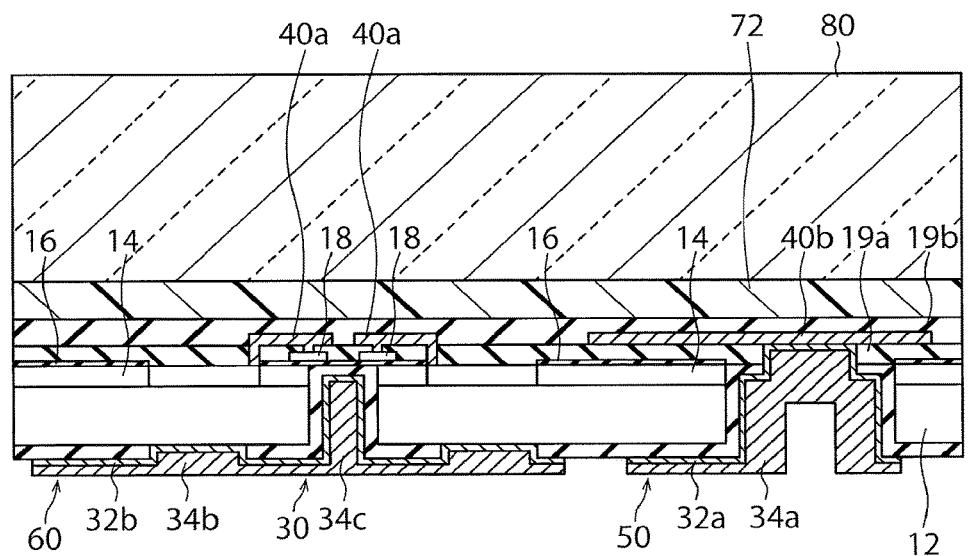
FIG. 15 is a cross-sectional view showing a method of manufacturing the photodetector according to the second embodiment.

A method of manufacturing the photodetector according to the second embodiment will be described below with reference to FIGS. 15 and 16.

The method according to the second embodiment has the same process as the method according to the first embodiment until the step shown in FIG. 10, i.e., until the opening 74a for TSV electrode and the opening 74b for back electrode 60 of each of the light detection cells are formed.

Subsequently, a TSV electrode 50 is formed on the bottom and the side surface of the openings 74a for TSV electrode 50, a backside electrode 60 is formed on the bottom and the side surface of the opening 74b for back electrode 60, and a light blocking portion 30 is formed on the bottom and the side surface of the light blocking groove 30a shown in FIG. 10. The TSV electrode 50 including a barrier metal layer 32a and an electrode layer 34a, the backside electrode 60 including a barrier metal layer 32b and a metal layer 34b, and the light blocking portion 30 including light blocking material 30b with a barrier metal layer 34c and an electrode layer 34c are formed by sequentially disposing a barrier metal layer of Ti, for example, and a metal layer of Cu, for example, and patterning them. At the same time, the electrode layer 34b between the light detection cells and the metal layer 34c are electrically connected to each other (FIG. 15). The barrier metal layers of Ti are formed by sputtering, and the metal layers of Cu are formed by plating. The metal layers may be formed of at least one metal selected from the group consisting of gold (Au), silver (Ag), nickel (Ni), zinc (Zn), chromium (Cr), and tin (Sn) instead of Cu. Since the light blocking material 30b is formed by plating, it may be filled into the light blocking portion 30 without voids.

Figure 16:
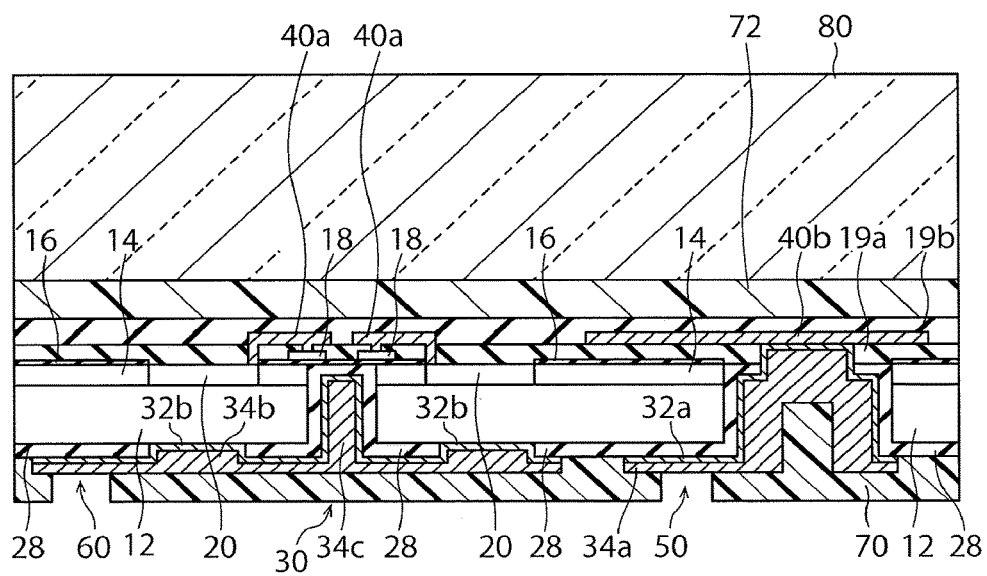
FIG. 16 is a cross-sectional view showing the method of manufacturing the photodetector according to the second embodiment.

Thereafter, a solder resist 70 is applied to the back surface of the silicon substrate 12 to cover the TSV electrode 50, the backside electrode 60, and the light blocking portion 30 as shown in FIG. 16. Subsequently, openings communicating with the TSV electrode 50 and the backside electrode 60 are formed, and a thermosetting treatment is performed at a temperature of 200° C. or less. The photodetector 1 according to the second embodiment is completed in this manner.

As described above, since the metal layer 34c serving as the light blocking material 30b is formed by plating in the photodetector according to the second embodiment, it may be filled in the light blocking groove 30a without voids. This may improve the reliability of the photodetector even if a metal is used as the light blocking material.

Furthermore, the barrier metal layer 32c and the metal layer 34c of the light blocking portion 30 may be formed at the same time as the barrier metal layer 32a and the electrode layer 34a of the TSV electrode 50 and the barrier metal layer 32b and the electrode layer 34b of the backside electrode 60 are formed. Therefore, the manufacturing process may become simpler than that of the first embodiment.

Third Embodiment

Radiation detectors including scintillators and photodetectors are also known. The scintillators receiving radiation rays emit visible light rays, which may be detected by photodetectors such as photodiodes and photomultipliers. The number of photons in the visible light rays emitted from a scintillator is proportional to the radiation energy incident to the scintillator. Therefore, the radiation energy may be measured by counting the number of photons included in the visible light rays emitted from the scintillator. This can be performed by means of a photodetector in which light detection cells including APDs operating in Geiger mode are arranged in an array. In a third embodiment, a radiation detector will be described.

Figure 17:
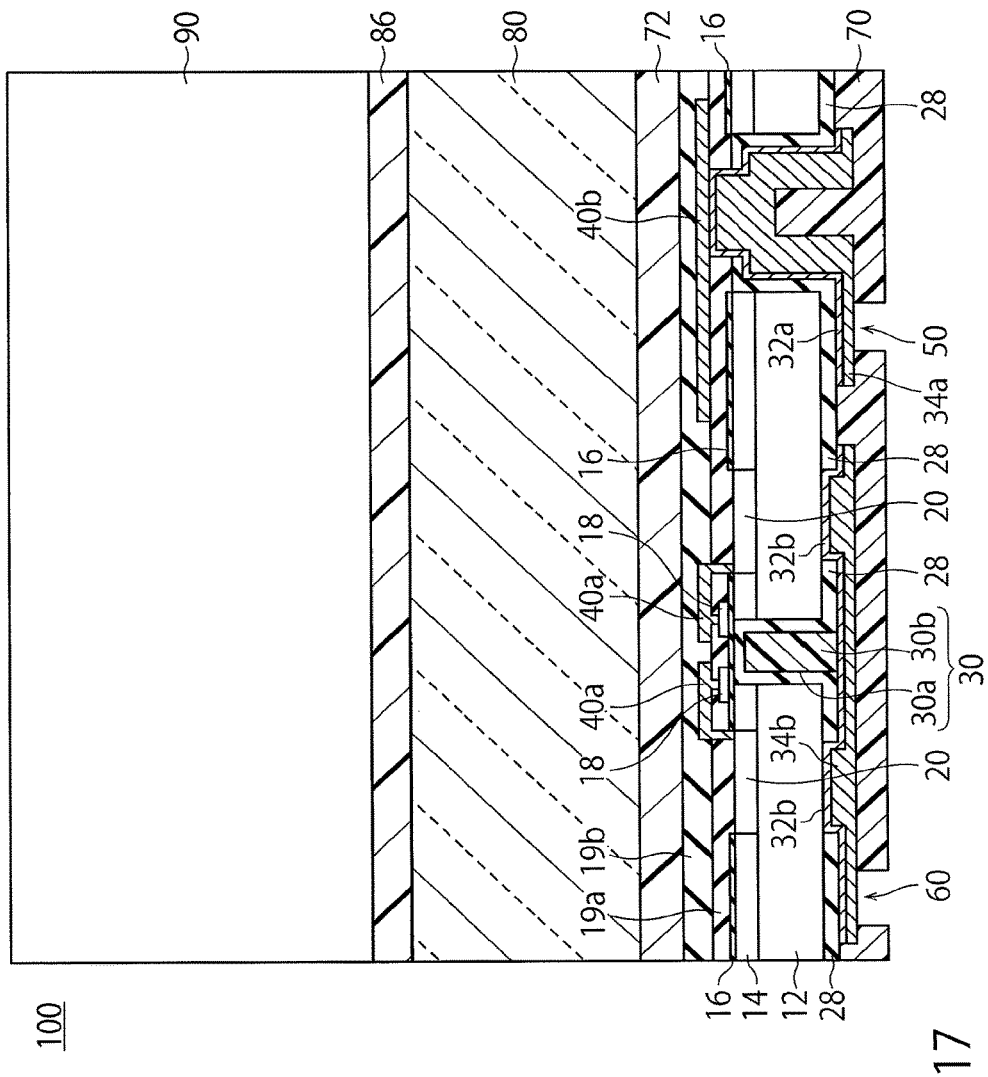
FIG. 17 is a cross-sectional view of a radiation detector according to a third embodiment.

FIG. 17 is a cross-sectional view of a radiation detector according to the third embodiment. The radiation detector 100 according to the third embodiment includes the photodetector 1 according to any of the first to second embodiments, and a scintillator 90 that receives radiation rays and emits visible light rays. In FIG. 17, the photodetector according to the first embodiment as the photodetector 1 is used. The photodetector 1 and the scintillator 90 are bonded by an adhesion layer 86. Scintillation materials such as LGSO or LYSO may be used as the scintillator 90. The adhesion layer 86 has a transparency sufficient enough to pass the visible light rays from the scintillator 90. The thickness of the adhesion layer 86 is approximately a few tens µm to 100 µm.

Since the light blocking groove 30a of the photodetector in the radiation detector according to the third embodiment is disposed on the back surface side of the silicon substrate 12, the black resist may be filled into the light blocking groove 30a after the APDs are formed. Therefore, the black resist is not subjected to a high-temperature process (for example, at a temperature of 400° C. or more) to form the APDs. And since a circumference of each of the light detection cells is formed to be a closed curve continuously surrounding the respective light detection cells 20 when viewed from the back surface side of the silicon substrate 12, it is possible to largely reduce the optical crosstalk.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A photodetector comprising:
    a substrate with a first face and a second face that is opposite to the first face;
    a plurality of pixels disposed to the substrate,
    each pixel including:
    a plurality of light detection cells disposed on the first face of the substrate, each light detection cell having a first terminal and a second terminal that connect to the substrate, each light detection cell being surrounded by a first opening having a continuous closed curve shape formed on the second face when viewed from a side of the second face of the substrate:
    a first wiring line disposed on the first face of the substrate to connect to the first terminal of each of the light detection cells;
    a first insulating film covering the second face of the substrate and a side face of a second opening disposed on the second face of the substrate, and penetrating the substrate to expose a part of the first wiring line, and a side face and a bottom of the second opening;

a plurality of first electrodes, each of the plurality of the first electrodes being disposed in corresponding one of third openings and connected to the second face of the substrate, the third openings being disposed in the first insulating film and exposing a part of respective regions of the light detection cells in the second face of the substrate:

a second electrode disposed on the second face of the substrate and connecting the plurality of the first electrodes; and a light blocking material filled to the first opening.

2. The photodetector according to claim 1, further comprising a third electrode disposed in the second opening and connected to the part of the first wiring line.

3. The photodetector according to claim 1, wherein the light blocking material is black resist.

4. The photodetector according to claim 1, wherein the light blocking material is a metal.

5. The photodetector according to claim 1, wherein the substrate includes an n-type substrate and a p-type epitaxial layer disposed on the n-type substrate, and the light detection cells are disposed on the p-type epitaxial layer.

6. The photodetector according to claim 1, wherein the pixels are arranged in an array form.

7. The photodetector according to claim 1, wherein each of the light detection cells includes an avalanche photodiode.

8. The photodetector according to claim 1, further comprising:

a second insulating film disposed on the first face of the substrate to cover the light detection cells and the first wiring line; and a transparent support member disposed on a side of the second insulating film opposite to the substrate, the support member being bonded with the second insulating film via an adhesion material.

9. A radiation detector comprising:

a scintillator that converts radiation rays to visible light rays; and the photodetector according to claim 1 that receives the visible light rays converted by the scintillator.

10. The detector according to claim 9, further comprising a third electrode disposed in the second opening and connected to the part of the first wiring line.

11. The detector according to claim 9, wherein the light blocking material is black resist.

12. The detector according to claim 9, wherein the light blocking material is a metal.

13. The detector according to claim 9, wherein the substrate includes an n-type substrate and a p-type epitaxial layer disposed on the n-type substrate, and the light detection cells are disposed on the p-type epitaxial layer.

14. The detector according to claim 9, wherein the pixels are arranged in an array form.

15. The detector according to claim 9, wherein each of the light detection cells includes an avalanche photodiode.

16. The detector according to claim 9, further comprising:

a second insulating film disposed on the first face of the substrate to cover the light detection cells and the first wiring line; and a transparent support member disposed on a side of the second insulating film opposite to the substrate, the support member being bonded with the second insulating film via an adhesion material.

* * * * *